United States Patent
Hsu

(10) Patent No.: US 6,538,893 B1
(45) Date of Patent: Mar. 25, 2003

(54) SECURING DEVICE FOR A LOCKING MEMBER OF A HEAT DISSIPATING ELEMENT OF A CPU

(76) Inventor: Hsien-Keng Hsu, No. 1, Ta Tung Farm, Feng Ming Village, Chu Tien Hsiang, Pingtung Hsien (TW)

( * ) Notice: Subject to any disclaimer, the term of this patent is extended or adjusted under 35 U.S.C. 154(b) by 0 days.

(21) Appl. No.: 10/026,899

(22) Filed: Dec. 27, 2001

(51) Int. Cl.[7] ................................................. H05K 7/20
(52) U.S. Cl. ........................ 361/719; 24/457; 257/718; 361/704
(58) Field of Search ................................. 248/505, 510; 24/453, 457, 458, 625; 174/16.3; 257/718, 719, 726, 727; 165/80.3, 185; 361/703, 687, 704, 709–712, 717–719, 807, 809

(56) References Cited

U.S. PATENT DOCUMENTS

| | | | | |
|---|---|---|---|---|
| 5,894,408 A | * | 4/1999 | Stark et al. | 361/704 |
| 6,141,220 A | * | 10/2000 | Lin | 361/704 |
| 6,243,266 B1 | * | 6/2001 | Lo | 361/704 |
| 6,313,993 B1 | * | 11/2001 | Hinshaw et al. | 361/704 |
| 6,480,388 B1 | * | 11/2002 | Lee et al. | 361/704 |

* cited by examiner

Primary Examiner—Gerald Tolin
(74) Attorney, Agent, or Firm—Rosenberg, Klein & Lee

(57) ABSTRACT

A securing device for a locking member of a heat dissipating element of a CPU includes several engaging members and a main body. The heat dissipating element is locked between upper removable parts and a base of the locking member. The engaging members each has outwardly sticking engaging parts and inwardly sticking engaging parts; all the engaging parts are bent upwardly to become sloping surfaces; the outward engaging parts have sharp outer ends. The outward engaging parts of each of the engaging members engage one of annular walls around recesses formed on the base to fix the engaging member to the base. The main body is disposed under a main board with connecting poles thereof passing through a respective hole of the main board and central holes of the recesses. The connecting poles each has a truncated cone-shaped parts on the top, which will engage with the inward engaging parts at the bottoms when the poles pass through the central holes of the recesses; thus, the main body is fixedly connected to the base of the locking member disposed on the main board, making the heat dissipating element to come into contact with a CPU fitted to the main board.

4 Claims, 6 Drawing Sheets

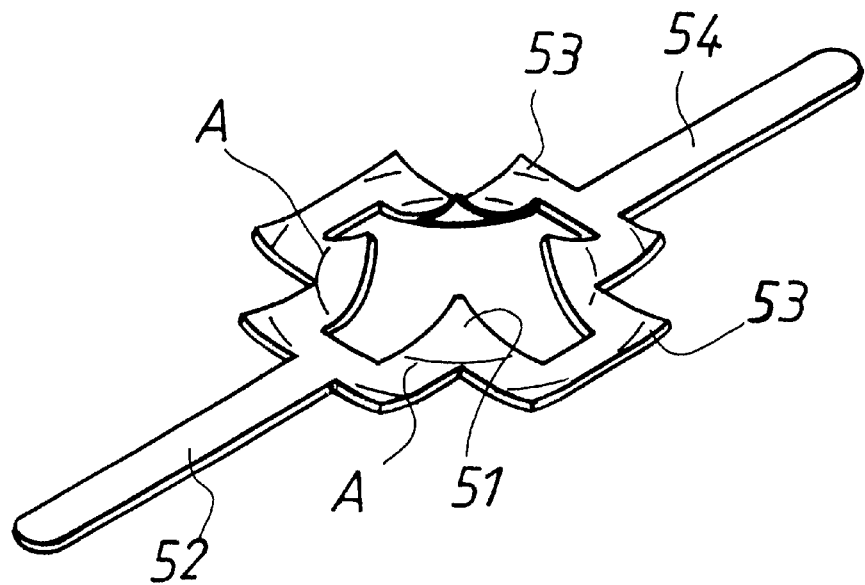
F I G. 2
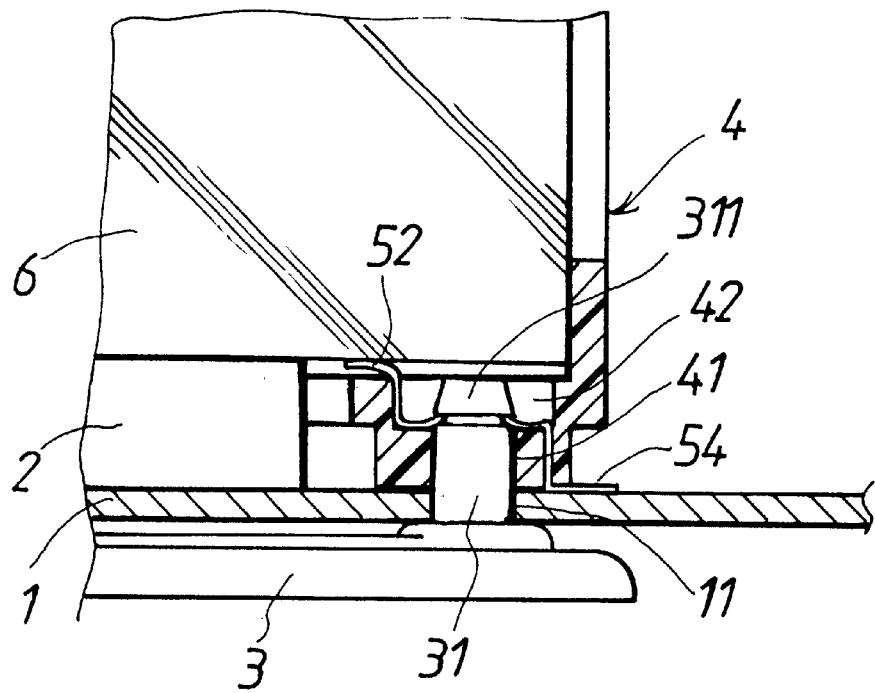
F I G. 6

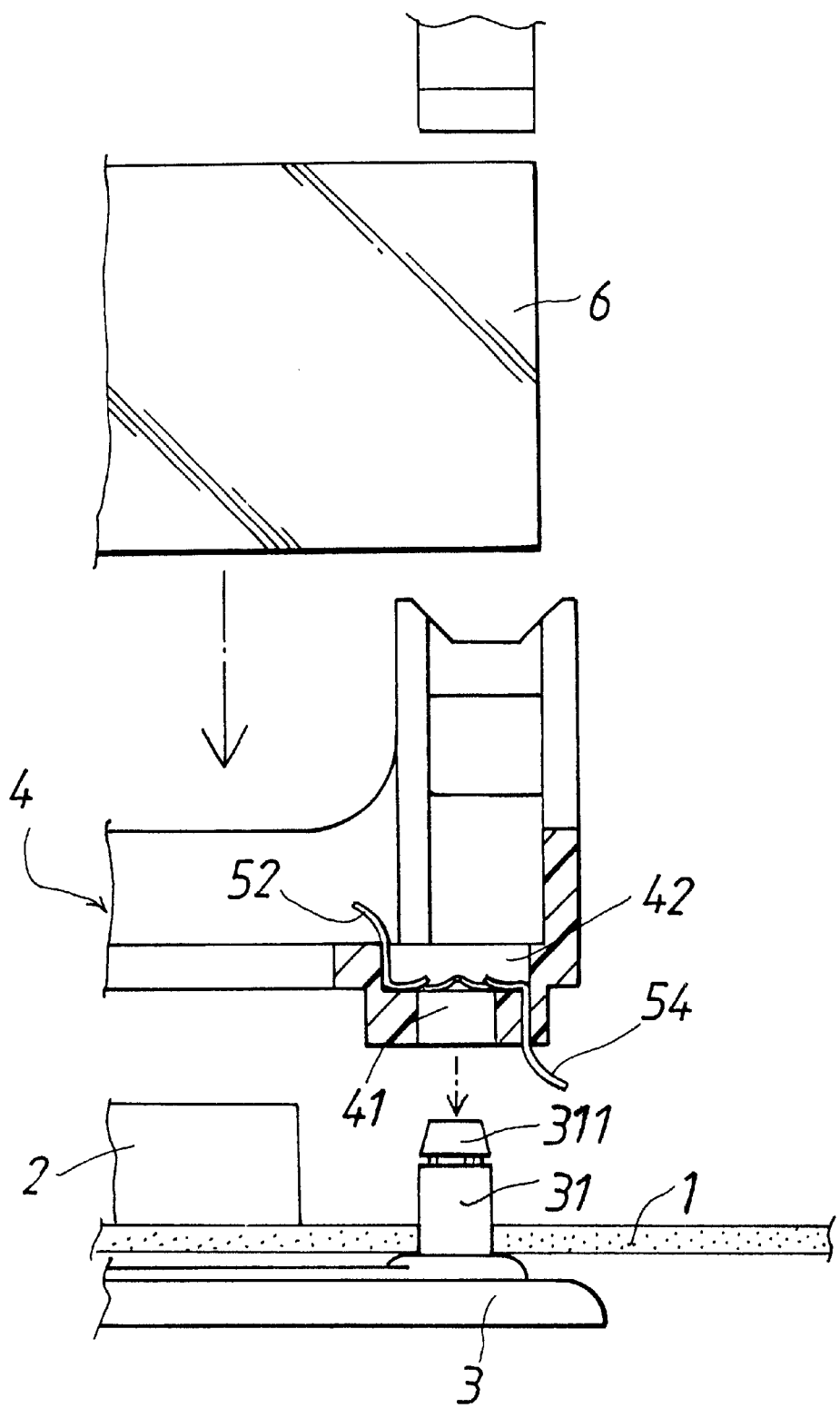
F I G. 3

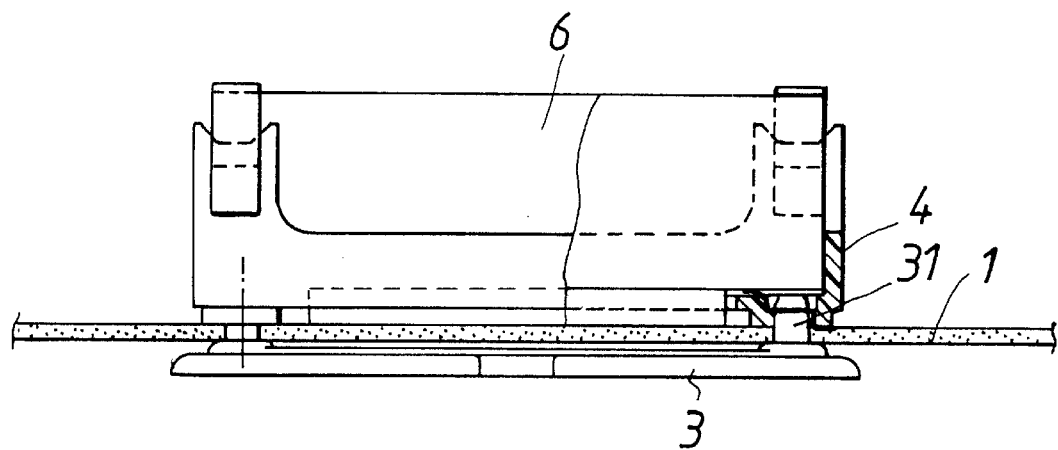
FIG. 4
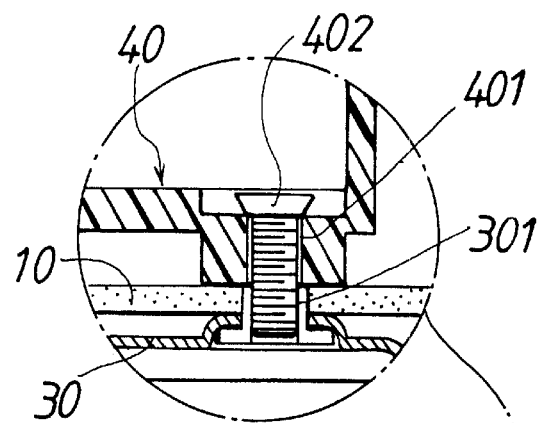
FIG. 8
(PRIOR ART)
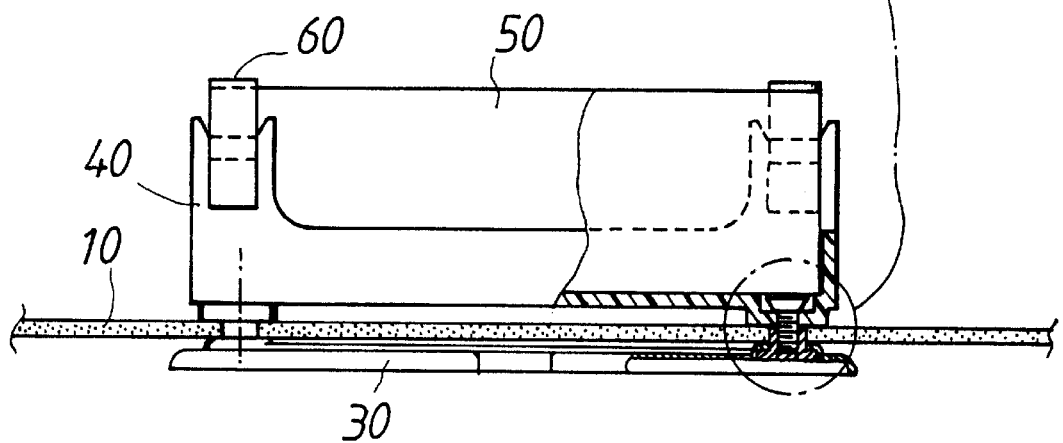

SECURING DEVICE FOR A LOCKING MEMBER OF A HEAT DISSIPATING ELEMENT OF A CPU

BACKGROUND OF THE INVENTION

The present invention relates to a securing device for a locking member of a CPU heat dissipating element, and more particularly, a securing device for a locking member of a CPU heat dissipating element that allows the locking member to be easily secured to the main board of a computer.

To dissipate the heat produced by a CPU when it is working, a heat dissipating element is used, which includes many radiating fins and a flat bottom side. The heat dissipating element is disposed on top of the CPU fitted on the main board of a computer such that the heat produced by the CPU can travel to the radiating fins.

Referring to FIGS. 7 and 8, a heat dissipating element 50 of a CPU is provided with a locking member; the locking member includes a base part 40 and two securing parts 60. The base part 40 has through holes 401 at four corners thereof, and two pairs of opposing engaging portions 403 sticking up from the edges thereof. The engaging portions 403 each has a through hole. The securing parts 60 each has a straight portion and two hooked engaging portions at two ends thereof.

The main board 10 of a computer is formed with four through holes 101 around the CPU 20 fitted thereto, each corresponding to one of the through holes 401 of the base part 40.

A securing device 30 is provided for securing the base part 40 of the locking member in position. The securing device 30 has a shape substantially like an X, and connecting poles 301 sticking up on end portions thereof; the connecting poles 301 each has a screw hole.

The base part 40 can be secured to the main board 10 with the connecting poles 301 being passed through the through holes 101 and the through holes 401 of the base part 40 from the bottom of the main board 10 and with screws 402 being screwed into the screw holes of the connecting holes 301. Thus, the heat dissipating element can be firmly locked between the base part 40 and the securing parts 60 by means of connecting the hooked engaging portions of the securing parts 60 to the engaging portions 403 of the base part 40 so as to press the straight portion of the securing parts 60 against the top of the heat dissipating element 50.

However, the locking member has a drawback that the base part 40 thereof has to be secured in position by means of using a screwdriver to screw the screws 402 into the four corners, costing relatively much labor and time in the assembly.

SUMMARY OF THE INVENTION

Therefore, it is a main object of the present invention to provide a securing device such that the locking member of a heat dissipating element of a CPU can be easily fixed in position.

It is another object of the present invention to provide a securing device for the locking member that can ground the CPU to dissipate electromagnetic waves produced by the CPU.

The securing device for a locking member of a heat dissipating element of a CPU includes four engaging members and a main body.

The engaging members each has several inwardly sticking and upwardly bent sharp engaging parts, which have a gap in between. The engaging members each further has several outwardly sticking and upwardly bent sharp engaging parts; the outwardly sticking sharp engaging parts engage with annular walls of recesses on a base of the locking member to secure the engaging members to the base. The base has a through hole on the center of each of the recesses thereof. The locking member further has several securing parts removably connected to the base thereof to lock the heat dissipating element on the base. The locking member is disposed on the main board for the heat dissipating element to come into contact with the CPU.

The main body has connecting poles sticking up thereon, and truncated cone-shaped parts on the top of each of the connecting poles; engaging trenches are formed between bottoms of the cone-shaped parts and the tops of the connecting poles. The main body is disposed under the main board with the truncated cone-shaped parts being each passed through the through holes of the base to allow the inwardly sticking engaging parts to engage with the engaging trenches so as to secure the base of the locking member to the main board.

BRIEF DESCRIPTION OF THE DRAWINGS

The present invention will be better understood by reference to the accompanying drawings, wherein:

FIG. 2 is a perspective view of the engaging member of the securing device according to the present invention.

FIG. 3 is a view showing the way for fitting the locking member to the securing device according to the present invention.

FIG. 4 is plan view of the main board with the heat dissipating element, the locking member and the securing device being secured thereto.

FIG. 6 is another fragmentary plan view of the securing device combined with the locking member according to the present invention.

FIG. 8 is a plan view of the main board with the conventional securing device, and the locking member secured in position.

DETAILED DESCRIPTION OF THE PREFERRED EMBODIMENT

Figure 1:
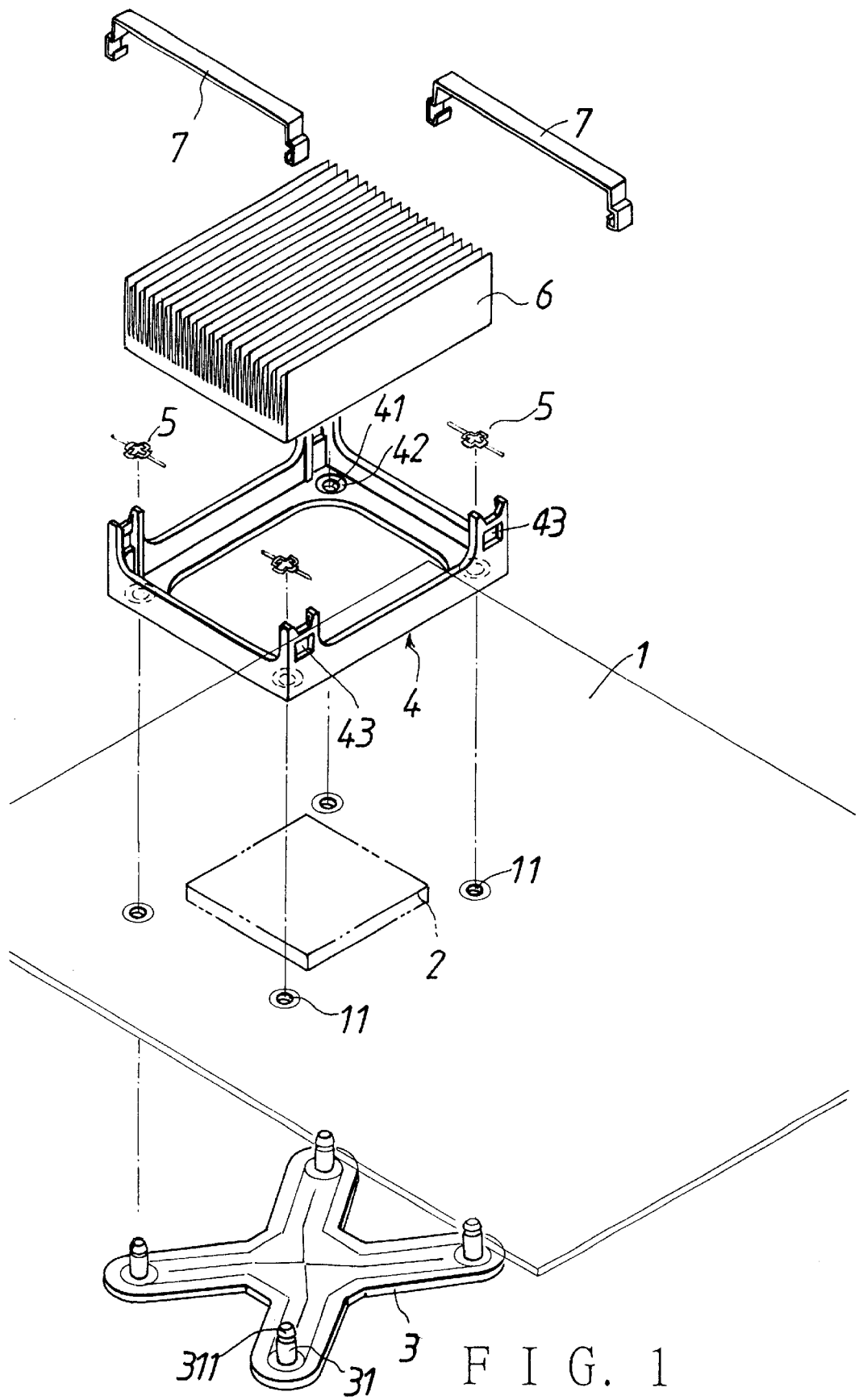
FIG. 1 is an exploded perspective view of the securing device and the locking member in the present invention.
Figure 5:
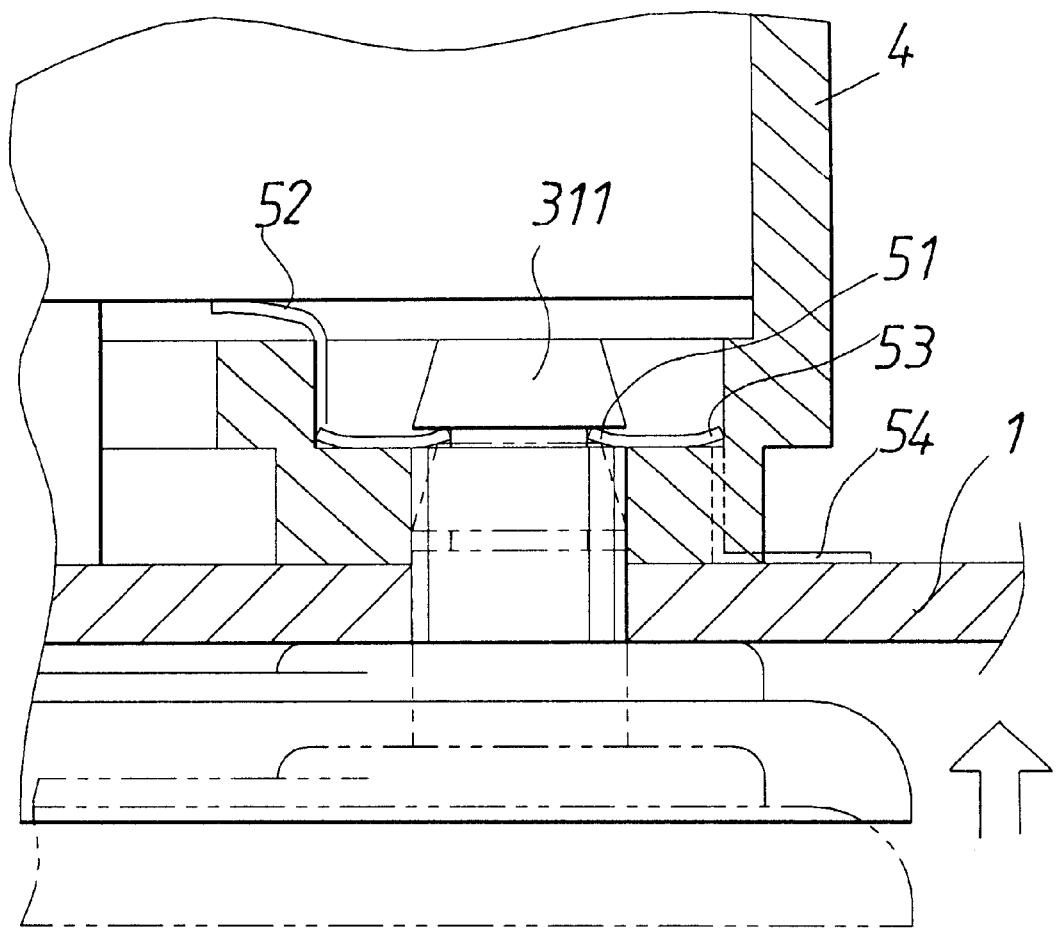
FIG. 5 is a fragmentary plan view of the securing device combined with the locking member according to the present invention.
Figure 7:
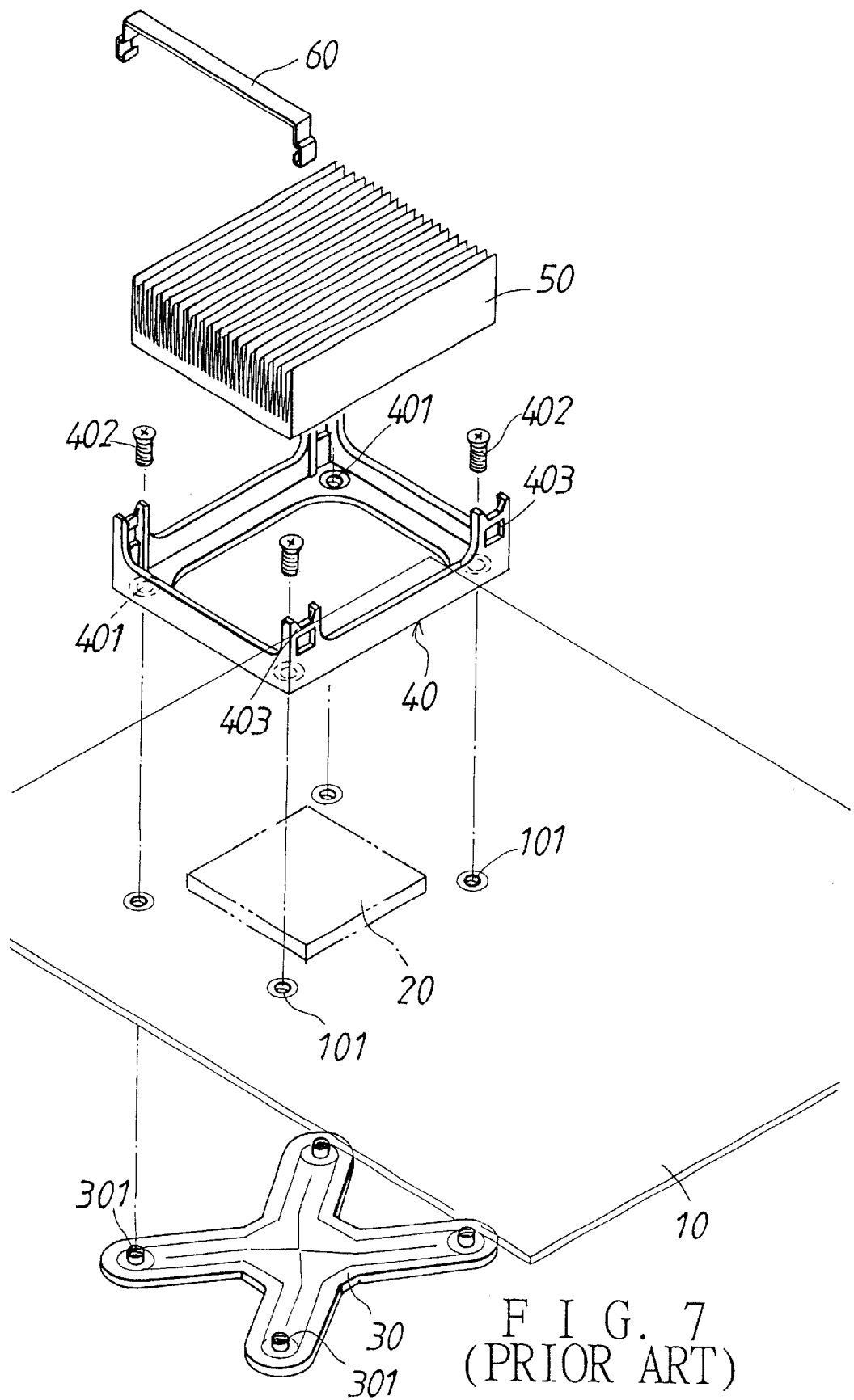
FIG. 7 is an exploded perspective view of the conventional securing device and the related parts in the Background.

Referring to FIGS. 1, 2 and 3, a securing device for a locking member of a heat dissipating element of a CPU of the present invention includes a main body 3 and four engaging members 5; the main body 3 has a shape substantially like an X, and connecting poles 31 sticking up on four end portions thereof; the connecting poles 31 each has a truncated cone-shaped parts 311 on the top thereof, and an annular engaging trench (not numbered) below the truncated cone-shaped part 311; the engaging members 5 are each provided with a cross-shaped gap in the middle portion such that four right angle-shaped inwardly sticking engaging parts 51 are formed. The inwardly sticking engaging parts 51 are bent upwards to become slopes. An imaginary circle A (FIG. 2) is used to substantially outline the lower parts of the inwardly sticking and upwardly bent engaging parts 51 of each of the engaging member 5; the diameter of the imaginary circle A is larger than that of the bottom of the truncated cone-shaped parts 311 of the main body 3.

The engaging members 5 are each further formed with several angle-shaped outwardly sticking engaging parts 53, which have sharp ends, and are also bent upwards to become slopes. A second imaginary circle is used to define the outer sharp ends of the outwardly sticking and upwardly bent engaging parts 53 of each of the engaging members 5. The engaging members 5 each further has flexible elongated conducting parts 52 and 54.

Referring to FIG. 1 again, a main board 1, to which CPU 2 is fitted, has four through holes 11 around the CPU 2. A locking member for the heat dissipating element 6 includes a base 4 and two connecting parts 7. The base 4 has through holes 41 at four corners thereof, and two pairs of engaging portions 43 sticking up from the edges thereof; the engaging portions 43 each has an engaging through hole (not numbered). The connecting parts 7 each has a straight portion, and two hooked engaging portions at two ends thereof; thus, the heat dissipating element 6 can be firmly locked between the base 4 and the connecting parts 7 by means of connecting the hooked engaging portions of the securing parts 7 to the engaging portions 43 of the base 4 so as to press the straight portion of the securing parts 7 against the top of the heat dissipating element 6. The connecting parts 7 can also be formed with other shapes as long as they can be removably connected to the base 4 to lock the heat dissipating element 6 in between.

Furthermore, the base 4 is provided with recesses 42 around the through holes 41 thereof and annular engaging walls, which are the surfaces around the recesses 42; the diameter of each of the annular engaging portions is slightly smaller than that of the second imaginary circle defining the outer sharp ends of the outer engaging parts 53 such that the sharp ends of the outer engaging parts 53 can firmly engage with the annular engaging wall around the recesses 42 when the outer engaging parts 53 are fitted into the recesses 42. Thus, the engaging members 5 can't fall off the recesses 42.

To secure the locking member base 4 of the heat dissipating element 6 to the main board 1, the base 4 is disposed on the main board 1 with the through holes 41 being each aligned with one of the through holes 11 of the main board 1, and the connecting poles 31 of the main body 3 of securing device are passed through the through holes 11, 41 and the cross-shaped gaps of the engaging members 5; the sloping sides of the truncated cone-shaped parts 311 help the cone-shaped parts 311 pass through the cross-shaped gaps without being stopped by the sharp ends of the upwardly bent inner engaging parts 51. Thus, the sharp ends of the upwardly bent inner engaging parts 51 engage with the engaging trenches of the connecting poles 31 to prevent the main body 3 of the securing device from falling off the main board 1, and also prevent the base 4 from falling off the main board 1.

In addition, referring to FIG. 6, the flexible elongated conductive parts 52 and 54 of the engaging members 5 are bent and disposed in such a manner as to come into contact with the heat dissipating element 6, and a grounding wire (not shown) of the main board 1 respectively to electrically connect the element 6 to the grounding wire of the main board 1. Thus, electromagnetic waves that are produced by the CPU 2 can be dissipated through the grounding wires.

From the above description, it can be easily understood that the securing device for a locking member of heat dissipating element has desirable features as follows:

1. The engaging members 5 of the securing device are already fixed to the recesses 42 of the base 4 when the base 4 leave the factory. Therefore, the user can easily secure the base 4 to the main board 1 by means of passing the connecting poles 31 of the main body 3 of securing device through the middle cross-shaped gaps of the engaging members 5, using relatively little labor and time as compared to the conventional securing means.

2. The user doesn't have to use other tool such as a screwdriver because the connecting poles 31 of the main body 3 themselves can engage with the sharp ends of the inner engaging parts 51 of the engaging members 5.

3. Being connected to both the heat dissipating element and the grounding wire of the main board 1, the flexible elongated conducting parts 52 and 54 of the engaging members 5 can help electromagnetic waves produced by the CPU to be dissipated.

What is claimed is:

1. A securing device for a locking member of a heat dissipating element of a CPU, comprising
    (1) a plurality of engaging members, said engaging members each having a plurality of inwardly sticking and upwardly bent engaging parts defining a gap in between; said engaging members each having a plurality of outwardly sticking and upwardly bent sharp engaging parts; said engaging members being fixed to a respective one of recesses formed at corners of a base of said locking member with said outwardly sticking and upwardly bent sharp engaging pars engaging with an annular wall around said recess; said base having through holes formed at centers of said recesses; said locking member having connecting parts removably connected to said base thereof for locking said heat dissipating element in between; said locking member being disposed on a main board for the heat dissipating element to come into contact with a CPU with said through holes of said base each being aligned with one of through holes of said main board;
    (2) a main body, said main body having connecting poles sticking up thereof, and truncated cone-shaped parts each formed on a top of one of said connecting poles; a bottom of each of said truncated cone-shape parts and said top of a respective one of said connecting poles defining an engaging trench in between; said main body being disposed under said main board with said truncated cone-shaped parts being each passed through one of said through holes of said base and one of said gaps of said engaging members to allow said inwardly sticking and upwardly bent engaging parts of said engaging members to engage with said engaging trenches thereof so as to secure said base of said locking member to said main board.

2. The securing device as claimed in claim 1, wherein said engaging members each has two flexible elongated conducting parts; said conducting parts coming into contact with said heat dissipating element and a grounding wire of said main board respectively when said base and said heat dissipating element are secured in position for allowing electromagnetic waves produced by said CPU to be dissipated therethrough.

3. The securing device as claimed in claim 1, wherein a circular area defined by lower portions of said inwardly sticking and upwardly bent engaging parts is at least slightly larger than said bottoms of said truncated cone-shaped parts of said main body.

4. The securing device as claimed in claim 1, wherein a circular area defined by outer ends of said outwardly sticking and upwardly bent engaging parts is at least slightly larger than said annular walls around said recesses of said locking member base.

* * * * *